United States Patent
Kawai

(10) Patent No.: US 10,555,448 B2
(45) Date of Patent: Feb. 4, 2020

(54) COMPONENT MOUNTING DEVICE

(71) Applicant: FUJI CORPORATION, Chiryu (JP)

(72) Inventor: Hidetoshi Kawai, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 600 days.

(21) Appl. No.: 15/119,762

(22) PCT Filed: Feb. 25, 2014

(86) PCT No.: PCT/JP2014/054558
§ 371 (c)(1),
(2) Date: Aug. 18, 2016

(87) PCT Pub. No.: WO2015/128945
PCT Pub. Date: Sep. 3, 2015

(65) Prior Publication Data
US 2017/0064883 A1    Mar. 2, 2017

(51) Int. Cl.
*H05K 13/04* (2006.01)

(52) U.S. Cl.
CPC ................ *H05K 13/0408* (2013.01)

(58) Field of Classification Search
CPC .. H05K 13/0408; H05K 13/041; H05K 13/08; H05K 13/0812; H05K 13/0813
See application file for complete search history.

(56) References Cited

U.S. PATENT DOCUMENTS

| | | | | |
|---|---|---|---|---|
| 4,951,388 | A * | 8/1990 | Eguchi | H05K 13/046 156/497 |
| 5,155,903 | A * | 10/1992 | Nakashima | H05K 13/0413 29/832 |
| 6,516,514 | B1 * | 2/2003 | Pruefer | H05K 13/0495 29/740 |
| 10,104,819 | B2 * | 10/2018 | Nishiyama | H05K 13/0404 |
| 2017/0064883 | A1 * | 3/2017 | Kawai | H05K 13/08 |

FOREIGN PATENT DOCUMENTS

JP    2008-311476 A    12/2008

OTHER PUBLICATIONS

International Search Report dated Apr. 28, 2014 for PCT/JP2014/054558 filed Feb. 25, 2014.

* cited by examiner

*Primary Examiner* — Minh N Trinh
(74) *Attorney, Agent, or Firm* — Oblon, McClelland, Maier & Neustadt, L.L.P.

(57) ABSTRACT

The component mounting device determines suction deviation (posture change) of the component from after suction of the component until prior to mounting of the component based on an immediately post-suction image which is acquired by imaging the suction nozzle from the side immediately after suction of the component and an immediately pre-mounting image that is acquired by imaging the suction nozzle from the side immediately prior to mounting of the component.

7 Claims, 12 Drawing Sheets

IMMEDIATELY PRE-MOUNTING IMAGE (REFERENCE: TOP VIEW)

IMMEDIATELY PRE-MOUNTING IMAGE

IMMEDIATELY PRE-MOUNTING IMAGE

COMPONENT MOUNTING DEVICE

TECHNICAL FIELD

This application relates to a component mounting device.

BACKGROUND ART

In the related art, a component mounting device is known that mounts a sucked component that is sucked by a suction nozzle on a board and determines the presence or absence of a suction defect of the sucked component such that it is possible to correctly mount the sucked component on the board. For example, the component mounting device of PTL 1 acquires a side image by imaging the suction nozzle from a side at a timing immediately before mounting, calculates a distance from a leading end of the suction nozzle to a lower end of the sucked component based on the side image, and determines presence or absence of so-called vertical suction that the sucked component is inclined without being able to correctly suck a component upper surface by comparing the calculated distance to a reference value.

CITATION LIST

Patent Literature

PTL 1: JP-A-2008-311476

SUMMARY

Here, there are cases where a posture of the sucked component changes during conveyance of the sucked component even if the sucked component has a correct posture immediately after suction. In addition, as a suction defect of the component, not only vertical suction which is described above, but positional deviation of the sucked component in a horizontal direction, rotation of the sucked component from the correct orientation, and the like occur. Ordinarily, the component mounting device which is described above acquires a lower image by imaging the sucked component from below by the suction nozzle during conveyance, and sets a correction value of the position and orientation when the component is mounted on the board based on the lower image. For this reason, when the suction defect of the component occurs during conveyance of the component after the lower image of the component is acquired, even if the component is mounted based on the correction value which is set from the lower image, there are cases where it is not possible to correctly mount the component. For this reason, there is a demand to appropriately detect the posture change of the component during conveyance. In particular, in recent years, this demand is increasing as reduced component sizes and the widespread use of components for which the suction surface of the component is not flat mean that suction is more likely to be unstable.

The component mounting device of the present disclosure has the main object of more appropriately detecting the suction defect of the component.

A component mounting device of the present disclosure includes a rotary type head on a circumference of which a plurality of nozzles that are able to suck a component are disposed, control means for controlling the head such that the plurality of nozzles are sequentially moved above a supply position of a component supply device as a target position so as to suck the component, and controlling the head such that the plurality of nozzles are sequentially moved above amounting position of amounting target as a target position so as to mount the component on the mounting target, side imaging means for acquiring an post-suction image by imaging the nozzle from the side after suction of the component and for acquiring an pre-mounting image by imaging the nozzle from the side prior to mounting of the component after acquiring the post-suction image, and determination means for determining a posture change of the component from after suction of the component to prior to mounting of the component based on the post-suction image and the pre-mounting image.

The component mounting device of the present disclosure is able to detect a change of the component posture during suction by the nozzle due to movement or rotation of a rotary type head by determining the posture change of the component from after suction of the component until prior to mounting of the component based on the post-suction image that is acquired by imaging the nozzle from the side after suction of the component and the pre-mounting image that is acquired by imaging the nozzle from the side prior to mounting of the component. For this reason, it is possible to appropriately detect a case where it is not possible to correctly mount the component due to the change of the component posture during component conveyance even if the component posture is correct after suction of the component. As a result, it is possible to more appropriately detect a suction defect of the component, thus, it is possible to stably perform mounting of the component.

In the component mounting device of the present disclosure, the determination means may determine positional deviation in the left and right direction of the component as the posture change based on the position in the left and right direction of the component with respect to the nozzle in the post-suction image and the position in the left and right direction of the component with respect to the nozzle in the pre-mounting image. By doing so, it is possible to appropriately detect the positional deviation in the left and right direction of the component during suction and prevent mounting defects caused by positional deviation in the left and right direction.

In the component mounting device of the present disclosure, the determination means may determine positional deviation in the rotation direction of the component as the posture change based on the length in the left and right direction of the component in the post-suction image and the length in the left and right direction of the component in the pre-mounting image. By doing so, it is possible to appropriately detect the positional deviation in the rotation direction of the component during suction and prevent mounting defects caused by positional deviation in the rotation direction.

In the component mounting device of the present disclosure, the determination means may determine positional deviation in the height direction of the component as the posture change based on a lower end position of the component in the post-suction image and a lower end position of the component in the pre-mounting image. By doing so, it is possible to appropriately detect the positional deviation in the height direction of the component during suction and prevent mounting defects caused by positional deviation in the height direction.

The component mounting device of the present disclosure may further include lower imaging means for acquiring a lower image by imaging the component which is sucked by the nozzle from below prior to acquisition of the pre-mounting image that is acquired after the post-suction image is acquired, and setting means for setting a correction value according to an amount of positional deviation of the component with respect to the nozzle based on the lower image, in which the lower imaging means may reacquire the lower image by reimaging the component from below in a case where it is determined that the posture change of the component exceeds a permissible range by the determination means, the setting means may reset the correction value based on the reacquired lower image, the control means may control the head such that the component is mounted after correction is performed which relates to the mounting position based on the set correction value in a case where it is determined that the posture change of the component does not exceed the permissible range by the determination means, and control the head such that the component is mounted after correction is performed which relates to the mounting position based on the reset correction value in a case where it is determined that the posture change of the component exceeds the permissible range by the determination means. By doing so, after the correction value is temporarily set based on the lower image, even in a case where the posture change of the component is generated which exceeds the permissible range, it is possible to reset the correction value based on the reacquired lower image and appropriately mount the component at the mounting position based on the reset correction value. That is, it is possible to prevent a situation in which correct mounting of the component becomes impossible due to the posture of the component changing after the correction value has been temporarily set.

In addition, in the component mounting device of the present disclosure, the control means may rotatably control the head intermittently at each predetermined angle such that the plurality of nozzles are sequentially moved to each target position, the imaging means may acquire the post-suction image by imaging the nozzle when the nozzle is at an immediately post-suction position advanced from the target position above the supply position by the predetermined angle, and acquire the pre-mounting image by imaging the nozzle when the nozzle is at an immediately pre-mounting position prior to the target position above the mounting position by the predetermined angle, and an orientation of the nozzle which is imaged at the immediately post-suction position and an orientation of the nozzle which is imaged at the immediately pre-mounting position may be the same orientation. By doing so, it is possible to easily perform comparison of the post-suction image and the pre-mounting image, and it is possible to quickly detect suction defects of the component.

In addition, in the component mounting device of the present disclosure, the imaging means may acquire an image after mounting by imaging the nozzle from the side after mounting of the component, and the determination means may determine whether the component is mounted on a mounting target by the nozzle based on the image after mounting. By doing so, since it is possible that an imaging means for detecting that the component remains without being mounted due to some abnormality after component mounting and an imaging means for detecting the posture change are combined, it is possible to set a compact configuration in comparison to provision of multiple separate imaging means.

DETAILED DESCRIPTION

Figure 1:
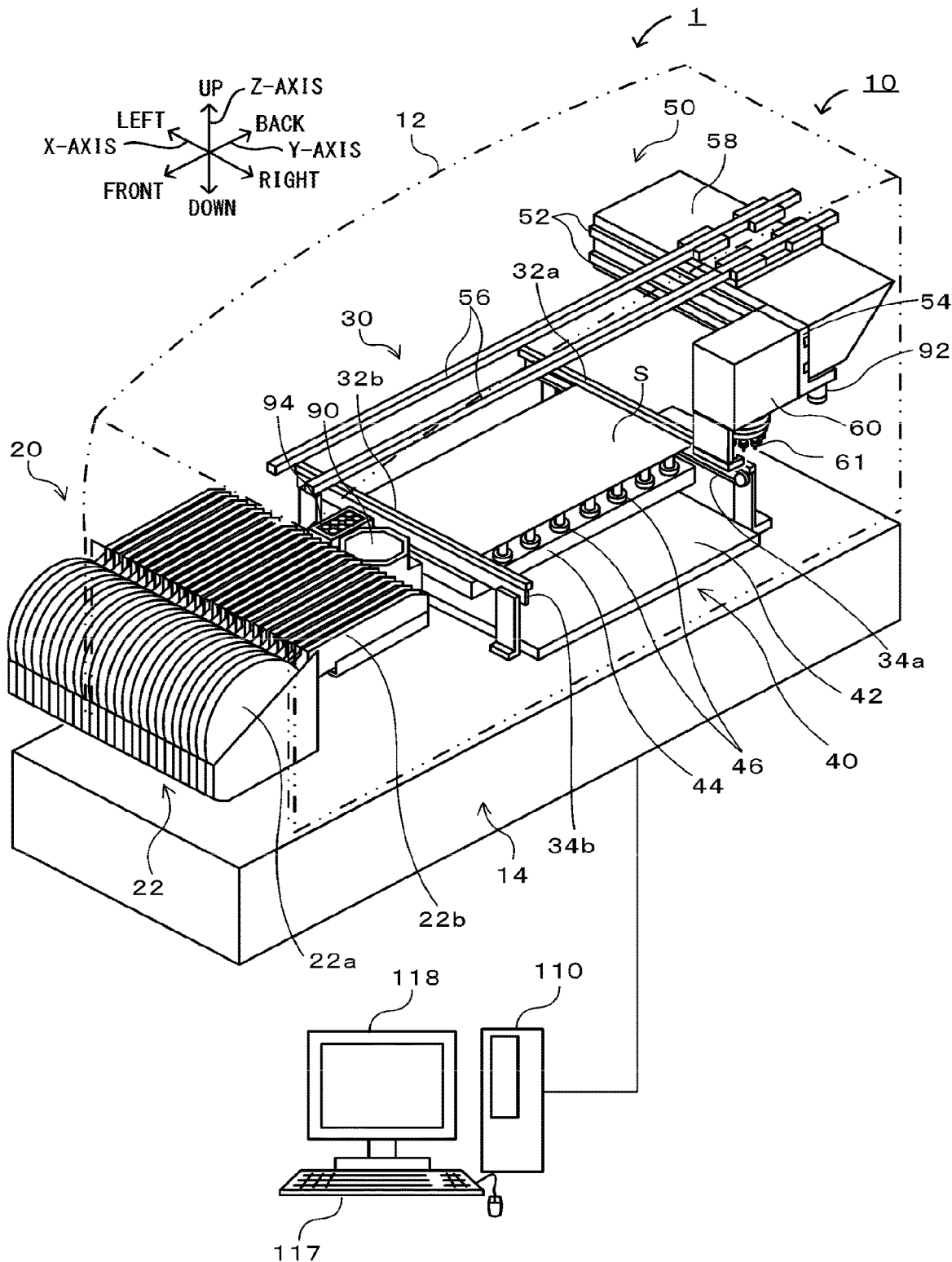
FIG. 1 is a configuration diagram illustrating an outline configuration of a component mounting system 1.
Figure 2:
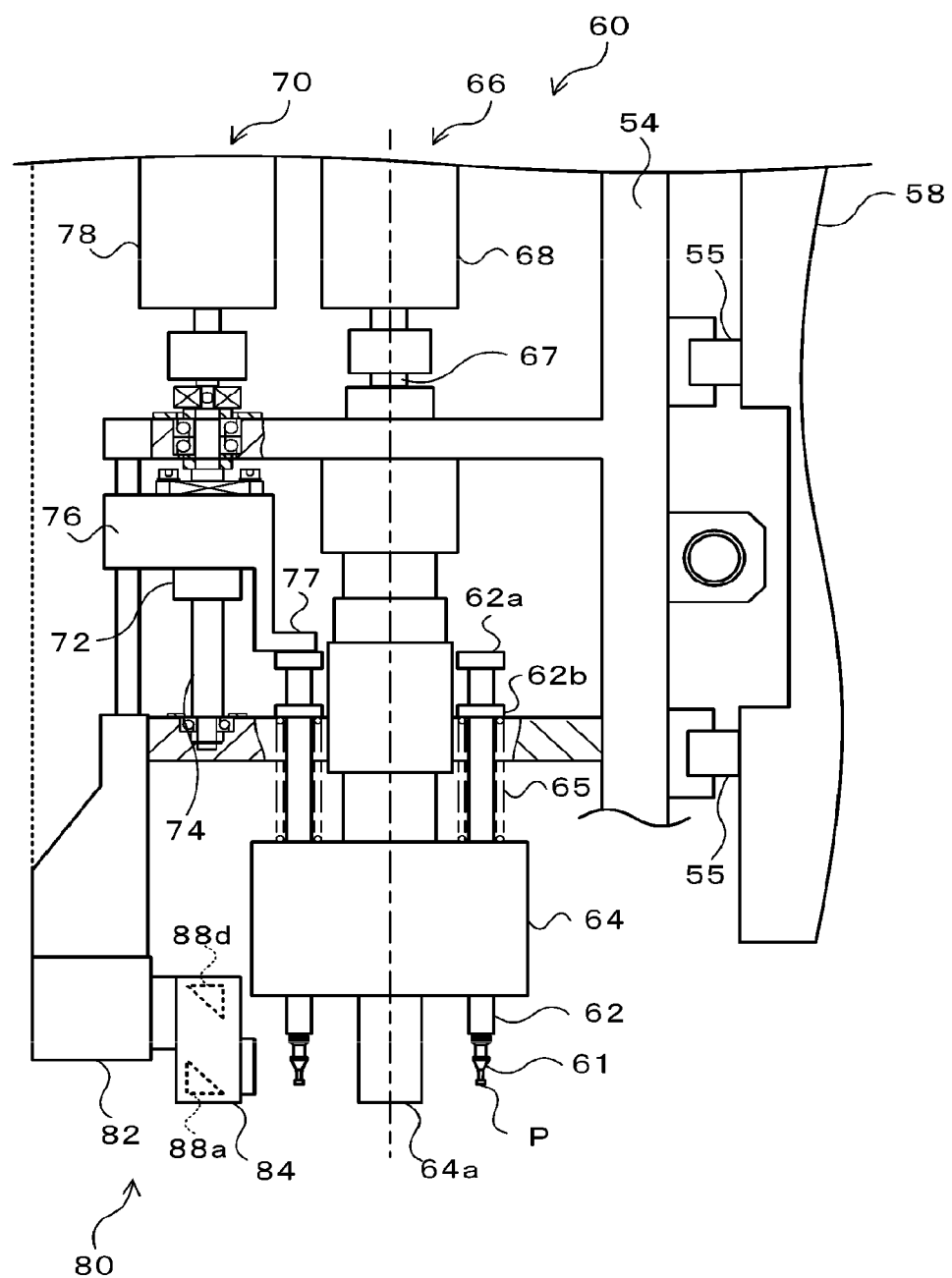
FIG. 2 is a configuration diagram illustrating an outline of a side face configuration of a head unit 60.
Figure 3:
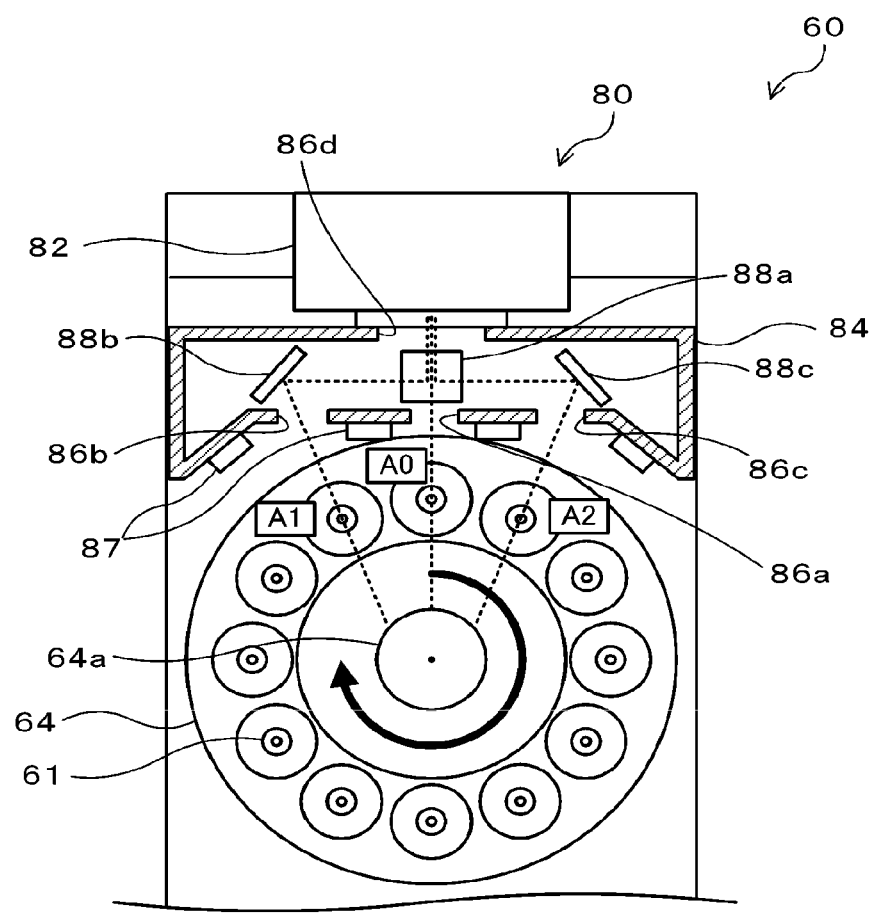
FIG. 3 is a configuration diagram illustrating an outline of a lower face configuration of the head unit 60.
Figure 4:
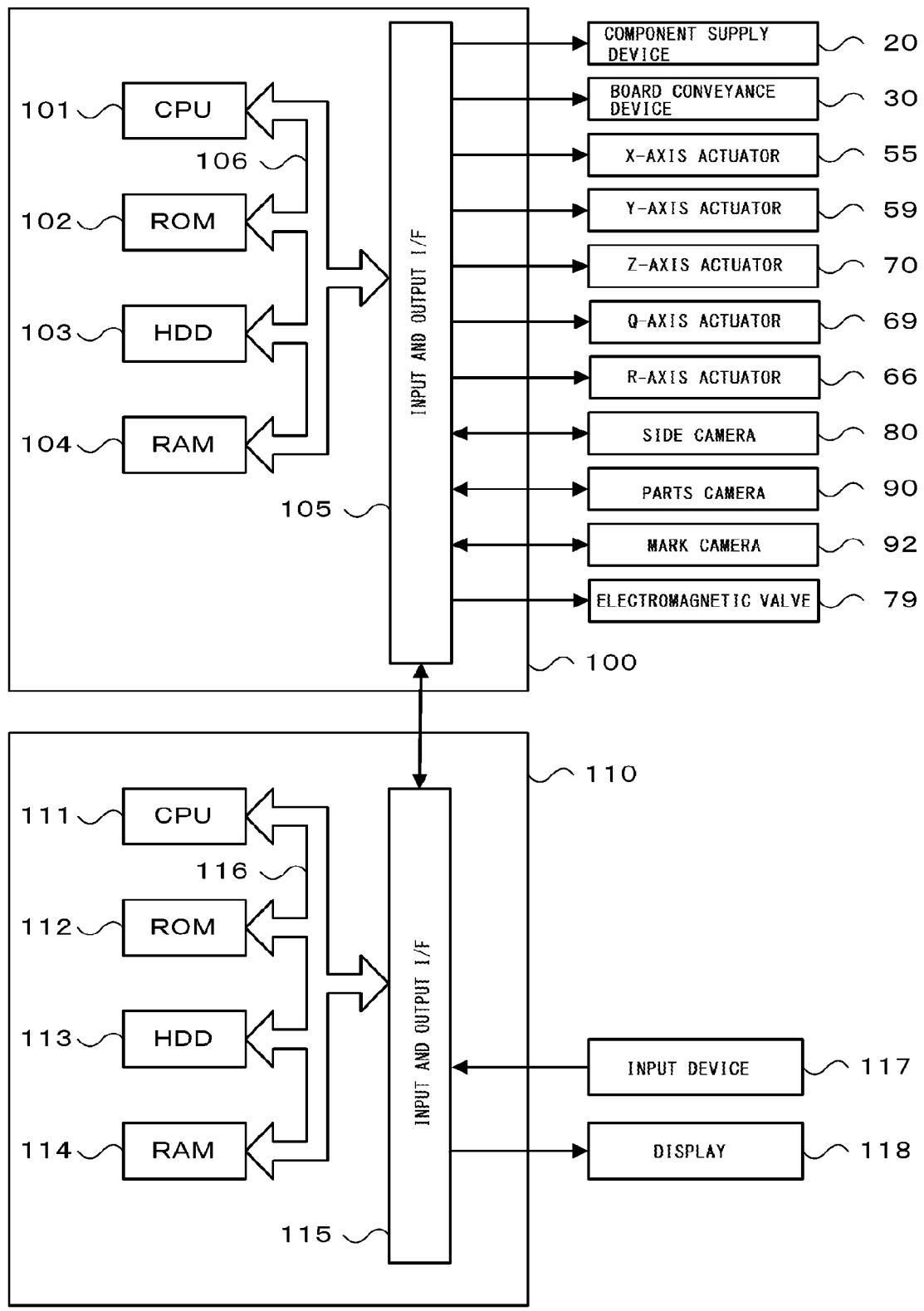
FIG. 4 is a block diagram illustrating an electrical connection relationship between a control device 100 and a management device 110.

Next, embodiments of the present disclosure will be described below with reference to the drawings. FIG. 1 is a configuration diagram illustrating an outline configuration of a component mounting system 1. FIG. 2 is a configuration diagram illustrating an outline of a side face configuration of a head unit 60, FIG. 3 is a configuration diagram illustrating an outline of a lower face configuration of the head unit 60, and FIG. 4 is a block diagram illustrating an electrical connection relationship between a control device 100 and a management device 110. The component mounting system 1 is provided with a component mounting device 10 which mounts an electronic component (hereinafter, referred to as "component") P to a circuit board (hereinafter, referred to as "board") S and the management device 110 which performs management of the entirety of the system. Note that, in the present embodiment, a left and right direction in FIG. 1 is an X-axis direction, a front and back direction is a Y-axis direction, and an up and down direction is a Z-axis direction.

As shown in FIG. 1, the component mounting device 10 is provided with a component supply device 20 that is provided with a reel and tray in which the component P is accommodated, a board conveyance device 30 which conveys the board S, a back-up device 40 which backs up the conveyed board S, a moving mechanism 50 which moves the head unit 60 that sucks the component P and is mounted on the board S, and the control device 100 which controls the entirety of the mounting device (refer to FIG. 4), and accommodates the board conveyance device 30, the back-up device 40, the moving mechanism 50, and the head unit 60 within a housing 12. Note that, only one component mounting device 10 is illustrated in FIG. 1, but a plurality of component mounting devices are lined up in parallel in the component mounting system 1.

As shown in FIG. 1, the component supply device 20 is provided with a tape feeder 22 which are attached so as to be attachable and detachable on the front side of the housing 12. The tape feeder 22 is provided with a reel 22a around which a tape is wound, and the component P is accommodated in a predetermined interval in each cavity of the tape. The component P is protected by a film which covers a front face of the tape, and when the tape is withdrawn from the reel 22a, the film is in a state of being peeled and exposed in the feeder section 22b.

As shown in FIG. 1, the board conveyance device 30 is provided with a pair of conveyor rails 32a and 32b which are provided spaced at a predetermined interval in the Y-axis direction (front and back direction in FIG. 1) on a base 14 which is installed at a lower stage portion of the housing 12 and a pair of conveyor belts 34a and 34b which are provided on surfaces that face each of conveyor rails 32a and 32b. The pair of conveyor rails 32a and 32b are configured as a member of a rectangular shape in which a longitudinal direction is the X-axis direction (left and right direction in FIG. 1), and a drive wheel and a driven wheel are provided on both ends in the longitudinal direction. The conveyor belts 34a and 34b span the drive wheel and a driven wheel which are provided on the conveyor rails 32a and 32b, and the board S is conveyed from left to right in FIG. 1 by the drive wheel being driven by a driving motor which is not shown in the drawings.

As shown in FIG. 1, the back-up device 40 is provided with a back-up plate 42 which is disposed to be able to be raised and lowered by a lifting and lowering device which is not shown in the drawings and a base plate 44 which is mounted on the upper surface of the back-up plate 42. A plurality of back-up pins 46 are erected on the base plate 44 in order to back up the board S from the rear side.

As shown in FIG. 1, the moving mechanism 50 is provided with a guide rail 56 which is provided along the Y-axis direction on an upper portion of the device, a Y-axis slider 58 which is movable along the guide rail 56, a guide rail 52 which is provided along the X-axis direction on the side surface of the Y axis slider 58, and an X-axis slider 54 which is attached to the head unit 60 which is movable along the guide rail 52.

As shown in FIG. 2, a plurality of suction nozzles 61 which suck the component P, a cylindrical rotary head 64 on which a plurality of nozzle holders 62 which hold the suction nozzle 61 are disposed, an R-axis actuator 66 around which the rotary head 64 is rotated, a Z-axis actuator 70 around which the nozzle holder 62 is moved in the Z-axis direction, and a side camera 80 which images the suction nozzle 61 and the side surface of the component P which is sucked by the suction nozzle 61 are provided on the head unit 60.

The nozzle holder 62 is configured as a hollow cylindrical member which extends in the Z-axis direction. An upper end portion 62a of the nozzle holder 62 is formed in a larger circular shape than a shaft portion of the nozzle holder 62. In addition, the nozzle holder 62 is formed by a flange portion 62b with a larger diameter than the shaft portion at a predetermined position below the upper end portion 62a. A spring (coil spring) 65 is disposed between an annular surface below the flange portion 62b and a cavity, which is not shown in the drawings, that is formed on the upper surface of the rotary head 64. For this reason, the spring 65 is received in the cavity on the upper surface of the rotary head 64 and biases the nozzle holder 62 (flange portion 62b) upward.

As shown in FIG. 3, in the rotary head 64, a plurality (for example, 12) suction nozzles 61 are disposed at an interval at a predetermined angle (for example, an interval of 30 degrees) on a circumference of the same shaft as the rotary shaft. In addition, a cylindrical reflective body 64a which is able to reflect light is attached at a lower face center of the rotary head 64. Note that, the rotary head 64 of the present embodiment is provided in an inner portion with a Q-axis actuator 69 which individually rotates each nozzle holder 62 (refer to FIG. 4). Although omitted from the drawings, the Q-axis actuator 69 is provided with a driving gear which is meshed with a gear that is provided on the cylindrical outer periphery of the nozzle holder 62 and a driving motor which is connected to the rotary shaft of the driving gear. For this reason, in the present embodiment, since the plurality of nozzle holders 62 are able to rotate individually from each other about the shaft (Q direction), the nozzle holders 62 are able to rotate individually from each of the suction nozzles 61.

As shown in FIG. 2, the R-axis actuator 66 is provided with a rotary shaft 67 which is connected to the rotary head 64 and a driving motor 68 which is connected to the rotary shaft 67. The R-axis actuator 66 intermittently rotates the rotary head 64 at a predetermined angle by intermittently driving the driving motor 68 at a predetermined angle (for example, 30 degrees). Thereby, each suction nozzle 61 which is disposed on the rotary head 64 is moved at the predetermined angle in a peripheral direction. Here, the suction nozzle 61 sucks the component P which is supplied from the component supply device 20 and performs mounting of the component P of the board S when, out of the plurality of movable positions, the suction nozzle 61 is at a 12 o'clock position in FIG. 3. For this reason, the 12 o'clock position is a working position A0 (alternatively, a suction position A0 or amounting position A0). In addition, since an 11 o'clock position in FIG. 3 is a position one prior (immediately prior) to the working position A0 when the suction nozzle 61 moves in the circumferential direction (arrow direction in the drawing), the 11 o'clock position is referred to as an immediately prior position A1 (alternatively, immediately pre-mounting position A1), and since a 1 o'clock position in FIG. 3 is a position one after (immediately after) the working position A0 when the suction nozzle 61 moves in the peripheral direction (arrow direction in the drawing), the 1 o'clock position is referred to as an immediately after position A2 (alternatively, immediately post-suction position A2 or immediately post-mounting position A2).

As shown in FIG. 2, the Z-axis actuator 70 is configured as a feed screw mechanism which is provided with a screw shaft 74 which moves a ball screw nut 72 that extends in the Z-axis direction, a Z-axis slider 76 which is attached to the ball screw nut 72, and a driving motor 78 which is connected to the screw shaft 74 by the rotary shaft. The Z-axis actuator 70 moves the Z-axis slider 76 in the Z-axis direction by rotating and driving the driving motor 78. A substantially L-shape lever portion 77 that overhangs at the rotary head 64 side is formed on the Z-axis slider 76. The lever portion 77 is able to abut on the upper end portion 62a of the nozzle holder 62 which is positioned in a predetermined range that includes a working position P0. For this reason, when the lever portion 77 moves in the Z-axis direction accompanying movement in the Z-axis direction of the Z-axis slider 76, it is possible to move the nozzle holder 62 in the Z-axis direction.

As shown in FIG. 3, the side camera 80 is configured by a camera main body 82 which is provided on the lower portion of the head unit 60 and a housing 84 which has an optical system unit which forms an optical path of the camera main body 82. In the housing 84, three incident ports of a center incident port 86a, a left incident port 86b, and a right incident port 86c are formed on the rotary head 64 side, and a camera connection port 86d is formed on the camera main body 82 side. Note that, the center incident port 86a is formed at a position which faces the working position A0, the left incident port 86b is formed at a position which faces the immediately prior position A1, and the right incident port 86c is formed at a position which faces the immediately after position A2. In addition, the housing 84 is provided with a plurality of luminous bodies 87 such as LED which emit light toward the reflective body 64a of the rotary head 64 on the outer peripheral surface on the rotary head 64 side. The housing 84 is provided on the inside with three first prisms 88a, 88b, and 88c which refract light that is respectively incident from each incident port 86a, 86b, and 86c and a second prism 88d which refracts the light which is refracted by the three first prisms 88a, 88b, and 88c so as to be incident on the camera main body 82 via the camera connection port 86d (refer to FIG. 2). For this reason, except for light that is blocked by the suction nozzle 61 and the component P at the working position A0, light which is reflected by the reflective body 64a by emitting light from a luminous body 87 is refracted by the first prism 88a and the second prism 88d by causing the light to be incident from the center incident port 86a to the inside of the housing 84 and reaches the camera main body 82. In addition, except for light that is blocked by the suction nozzle 61 and the component P at the immediately prior position A1, light which is reflected by the reflective body 64a by emitting light from a luminous body 87 is refracted by a first prism 88b and a second prism 88d by causing the light to be incident from the left incident port 86b to the inside of the housing 84 and reaches the camera main body 82. In addition, except for light that is blocked by the suction nozzle 61 and the component P at the immediately after position A2, light which is reflected by the reflective body 64a by emitting light from a luminous body 87 is refracted by the first prism 88c and the second prism 88d by causing the light to be incident from the right incident port 86c to the inside of the housing 84 and reaches the camera main body 82.

Figure 5:
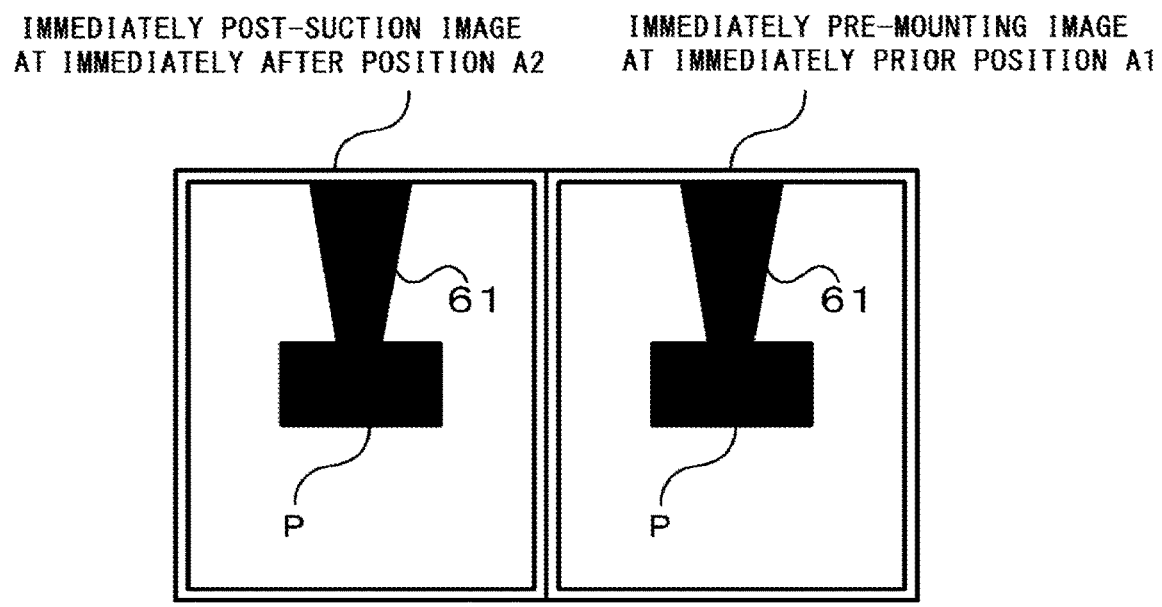
FIG. 5 is an explanatory view illustrating an example of an image that is acquired by imaging of a side camera 80.

In this manner, the side camera 80 is able to image the suction nozzle 61 which is at the working position A0, the suction nozzle 61 which is at the immediately prior position A1, and the suction nozzle 61 which is at the immediately after position A2, and acquire respective side images. FIG. 5 is an example of the image that is acquired by imaging of the side camera 80. FIG. 5 indicates aside image (hereinafter, referred to as an immediately post-suction image) at the immediately after position A2 immediately after the component P is sucked by the suction nozzle 61 and a side image (hereinafter, referred to as an immediately pre-mounting image) at the immediately prior position A1 immediately prior to the component P is mounted by the suction nozzle 61. Each image is projected by the suction nozzle 61 which blocks light or the component P as a black shadow. Here, the optical system unit of the housing 84 is configured such that an optical path of light which is incident from the left incident port 86b reaching the camera main body 82 and an optical path of light which is incident from the right incident port 86c reaching the camera main body 82 are symmetrical. For this reason, in a case where the suction nozzle 61 which sucks the component P is moved from the immediately after position A2 to the immediately prior position A1, if the suction nozzle 61 is not rotated about the Q axis, an orientation at which the side camera 80 images the suction nozzle 61 and the component P at the immediately after position A2 and an orientation at which the side camera 80 images the suction nozzle 61 and the component P at the immediately prior position A1 are the same orientation.

In addition, the component mounting device 10 is provided with a parts camera 90 for imaging from below the component P that is sucked by the suction nozzle 61 which is provided on the base 14, a mark camera 92 for imaging from above a board positional alignment fiducial mark which is provided on the board S that is attached to the X-axis slider 54, and a nozzle stocker 94 which stocks a plurality of types of suction nozzles 61.

The parts camera 90 is installed such that the imaging direction is an upper orientation between the component supply device 20 and the board conveyance device 30. The parts camera 90 images the component P that passes upward and the component P that is stopped above, and outputs the image which is obtained by imaging to the control device 100. The control device 100 determines whether or not the component P is normally sucked by the suction nozzle 61 and acquires an amount of positional deviation of the component P with respect to the suction nozzle 61 by comparing to an image (image processing data) in a normal suction state in which an input image is stored in advance.

The mark camera 92 is installed on the lower end of the X-axis slider 54 such that the imaging direction is orientated toward the board S. The mark camera 92 images the board positional alignment fiducial mark which is provided on the board S and outputs the image which is obtained by imaging to the control device 100. The control device 100 determines the position of the board S by recognizing the position of the mark by processing the input image.

As shown in FIG. 4, the control device 100 is configured as a micro-processor with a CPU 101 as the center, and is provided with a ROM 102 which stores a processing program, an HDD 103 which stores various data, a RAM 104 which is used as a work region, and an input and output interface 105 for performing exchange of an external apparatus and an electrical signal, and the like. These elements are connected via a bus 106. The control device 100 inputs an image signal or the like from the side camera 80, the parts camera 90, or the mark camera 92 via the input and output interface 105. In addition, the control device 100 outputs a drive signal or the like to the component supply device 20 or the board conveyance device 30, the back-up device 40, an X-axis actuator 55 which moves the X-axis slider 54, a Y-axis actuator 59 which moves the Y-axis slider 58, a Z-axis actuator 70 (driving motor 78), a Q-axis actuator 69 (driving motor), an R-axis actuator 66 (driving motor 68), and an electromagnetic valve 79 which performs communication and blocking between a vacuum pump which is not shown in the drawings and the suction nozzle 61 via the input and output interface 105. Note that, a position sensor which is not shown in the drawings is equipped on the X-axis slider 54 and the Y-axis slider 58, the control device 100 inputs positional information from the position sensors, and each slider is drivably controlled. In addition, a position sensor which is not shown in the drawings is equipped on the Z-axis actuator 70, the Q-axis actuator 69, and the R-axis actuator 66, the control device 100 inputs positional information from the position sensors, and each actuator is drivably controlled.

For example, a management device 110 is a general-purpose computer. As shown in FIG. 4, the management device 110 is a micro-processor with a CPU 111 as the center, and is provided with a ROM 112 which stores a processing program, an HDD 113 which stores production planning and the like of the board, a RAM 114 which is used as a work region, an input and output interface 115, and the like. These elements are connected via a bus 116. The management device 110 inputs the input signal from an input device 117 such as a mouse or a keyboard via the input and output interface 115. In addition, the management device 110 outputs the image signal to a display 118 via the input and output interface 115. Here, the production planning of the board is a determined plan in which some components P in the component mounting device 10 are mounted on the board in any order, creating many boards S on which the components P are mounted, or the like.

Figure 6:
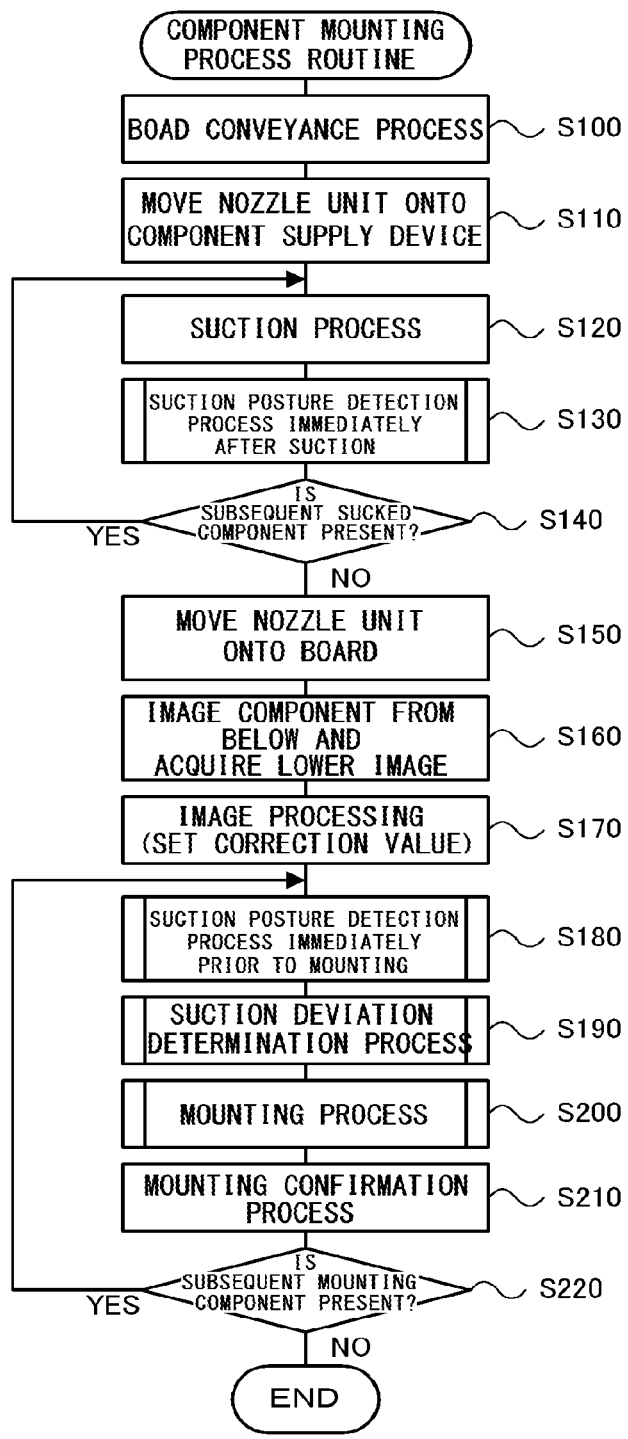
FIG. 6 is a flow chart illustrating an example of a component mounting process routine which is executed by a CPU 101 of the control device 100.

The subsequent sentence and hereinafter describes operation of the component mounting device 10 which is configured in this manner. FIG. 6 is a flow chart illustrating an example of a component mounting process routine which is executed by the CPU 101 of the control device 100. The routine is executed when a product start command is received from the management device 110.

In the component mounting process routine, first, the CPU 101 of the control device 100 performs aboard conveyance process which holds the board S by controlling the board conveyance device 30 and conveying the board S until coming to just above the back-up device 40 (step S100). At this time, the component supply device 20 (tape feeder 22) is in a state of being able to supply the component P by feeding the tape from the reel 22a. Subsequently, the CPU 101 of the control device 100 controls the X-axis actuator 55 and the Y-axis actuator 59 such that the working position A0 of the rotary head 64 is positioned just above the supply position to which the component P is supplied from the component supply device 20 and moves the head unit 60 onto the component supply device 20 (step S110). Subsequently, the CPU 101 of the control device 100 performs a suction process in which the component P is sucked (step S120). In the process, the CPU 101 of the control device 100 controls the R-axis actuator 66 such that the suction nozzle 61 that is positioned at the immediately prior position A1 is rotatably moved to the working position A0, controls the Z-axis actuator 70 such that the suction nozzle 61 is lowered until a suction port of the suction nozzle 61 abuts with the upper surface of the component P, and controls the electromagnetic valve 79 such that the suction nozzle 61 sucks the component P due to negative pressure acting on the suction port of the suction nozzle 61. Note that, the suction nozzle 61 to which the component P is sucked by the suction process of the previous time moves to the immediately after position A2 in a state in which the component P is sucked accompanying the suction process that is performed this time. When the CPU 101 of the control device 100 performs the suction process, the CPU 101 performs a suction posture detection process immediately after suction in which the component suction posture of the suction nozzle 61 that is moved to the immediately after position A2 is detected (step S130), and determines whether or not the component P which is subsequently sucked is present (step S140). Then, when the CPU 101 of the control device 100 determines that the component P which is subsequently sucked is present, the CPU 101 repeats a return process in step S120, and determines that the component P which is subsequently sucked is not present, the process proceeds to the process of the subsequent step S150.

Figure 7:
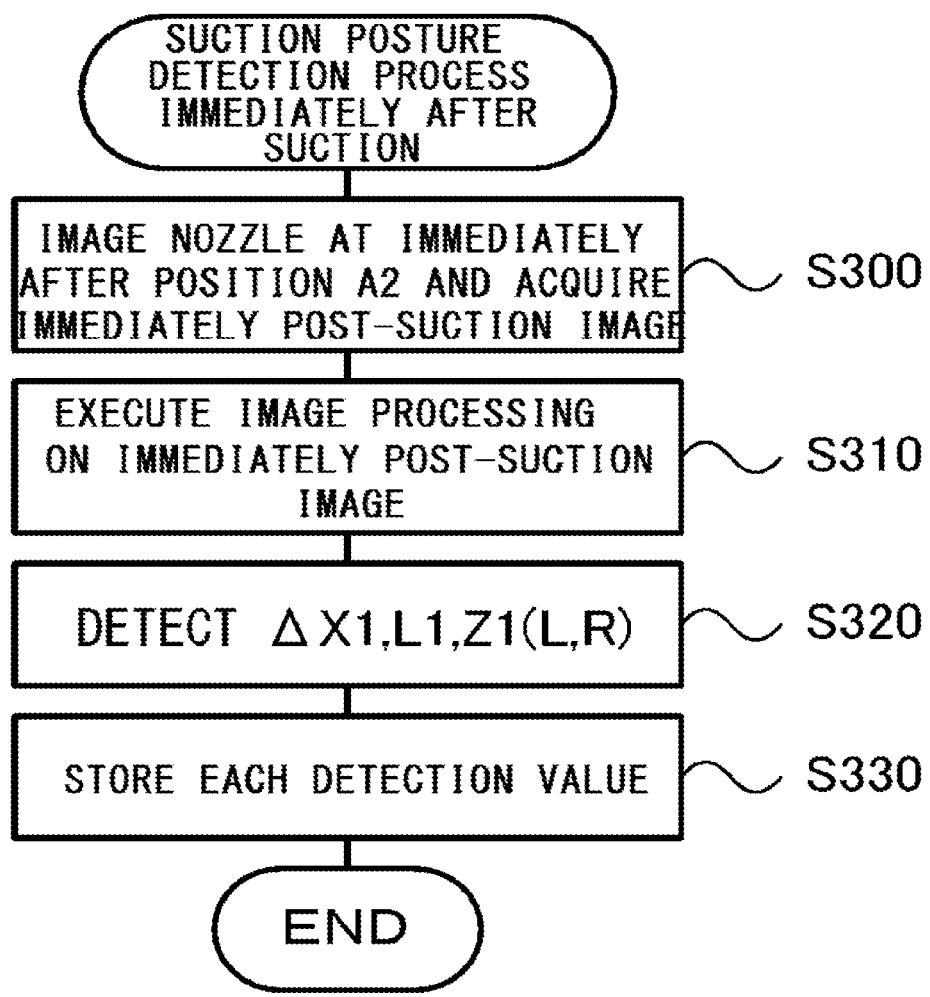
FIG. 7 is a flow chart illustrating an example of a suction posture detection process immediately after suction which is executed by the CPU 101 of the control device 100.

FIG. 7 is a flow chart illustrating an example of the suction posture detection process immediately after suction. In the process, first, the CPU 101 of the control device 100 causes the side camera 80 to image the suction nozzle 61 at the immediately after position A2 and the component P that is sucked by the suction nozzle 61 to acquire the immediately post-suction image (step S300), and executes image processing of the immediately post-suction image (step S310). As the image processing, the CPU 101 of the control device 100 extracts a pixel region which indicates the suction nozzle 61 and an image region which indicates the component P from the immediately post-suction image, and executes processes of finding a center position Xn in the X direction of the image region of the extracted suction nozzle 61, finding a center position Xp, a left end position XL, a right end position XR, and a lower end position Z in the X direction of the image region of the extracted component P, and the like. Next, as the value that indicates the suction posture of the component P of the suction nozzle 61, the CPU 101 of the control device 100 detects X direction deviation ΔX1 which is equivalent to suction deviation in the X direction, Q direction deviation L1 which is equivalent to suction deviation in the Q direction, and a Z direction position Z1 (L, R) which is equivalent to suction deviation in the Z direction (step S320), stores each detection value in the RAM 104 (step S330), and ends the suction posture detection process immediately after suction.

Figure 8A:
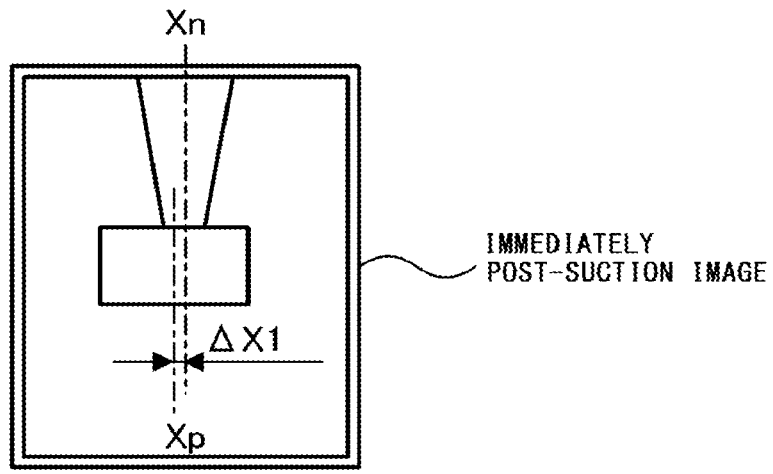
FIGS. 8A to 8C are explanatory views illustrating an example of a circumstance in which suction deviation is detected based on the immediately post-suction image.
Figure 8B:
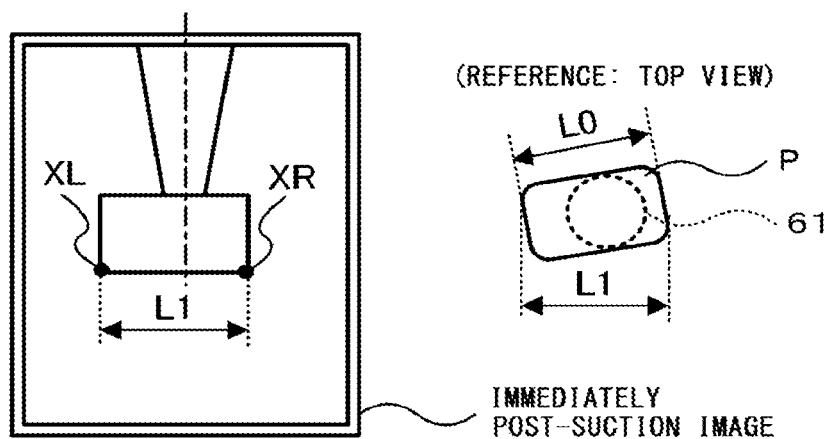
Figure 8C:
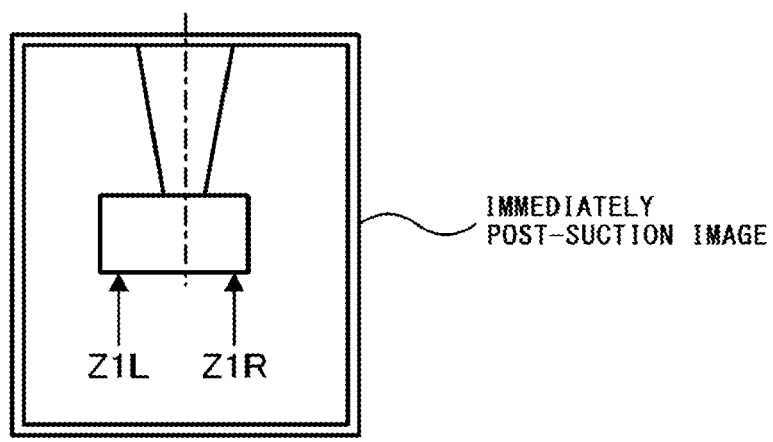

FIGS. 8A to 8C are explanatory views illustrating an example of a circumstance in which the suction posture is detected based on the immediately post-suction image. Note that, for convenience of description, FIGS. 8A to 8C or 10A to 10C described later indicate the suction nozzle 61 and the component P which are different from FIG. 5 in white. FIG. 8A indicates a state in which a difference between the center position Xn of the suction nozzle and the center position Xp of the component P is detected as the X direction deviation ΔX1. Note that, in the X direction deviation ΔX1, an absolute value of the difference indicates positional deviation, and positive and negative reference numerals indicate the direction of positional deviation. FIG. 8B indicates a state in which the width of the component P is detected as the Q direction deviation L1 based on the left end position XL and the right end position XR of the component P. Here, a reference top view of FIG. 8B indicates a state in which the width L1 of the component P that is detected in the picture is larger than the original width L0 of the component P in a case where the sucked component P is rotated about the shaft (Q direction) of the suction nozzle 61. For this reason, since the CPU 101 of the control device 100 is able to ascertain an approximate amount of rotation about the Q axis (Q direction deviation) from the width L of the component P, the CPU 101 detects the width of the component P as the Q direction deviation L1. Note that, the left end position XL and the right end position XR may use the left end position and the right end position on the lower end of the component P, and may detect the plurality of left end positions and right end positions and use an average position thereof. FIG. 8C indicates a state in which a lower left end position Z1L and a lower right end position Z1R of two left and right locations on the lower end position Z as the Z direction position Z1 (L, R). The Z direction position Z1 (L, R) is a value for detecting that the component P is sucked at an orientation that is raised up from a normal orientation (so-called upright suction) or the component P is sucked at an orientation that is oblique from the normal orientation (so-called oblique suction). The lower left end position Z1L and the lower right end position Z1R may be a position or the like at a determined distance from the center position Xp of the component P in each size of the component P. Note that, in a case where the X direction deviation ΔX1 or suction deviation L1 in the Q direction is a large value and the Z direction position Z1 (L, R) is greatly outside of a reference value, it is also possible for the CPU 101 of the control device 100 to determine that some abnormality during suction, for example, deviation or the like of the supply position of the component P is generated by the component supply device 20 (tape feeder 22).

Subsequently, the CPU 101 of the control device 100 controls the X-axis actuator 55 and the Y-axis actuator 59 such that the working position A0 of the rotary head 64 is positioned just above the mounting position of the board S via an upper part of the parts camera 90 and moves the head unit 60 onto the board S (step S150). In addition, when the CPU 101 of the control device 100 moves the head unit 60 on the parts camera 90, the CPU 101 images from below the component P which is sucked by the suction nozzle 61 and acquires the lower image of the component P (step S160), and executes image processing on the acquired lower image (step S170). As the image processing, the CPU 101 of the control device 100 executes a process of determining presence or absence of the component P, and determining whether or not the shape, size, suction position, or the like of the component P is normal. In addition, the CPU 101 of the control device 100 sets a correction value of the position or the orientation of the suction nozzle 61 and stores the correction value in the RAM 104 when the component P is mounted on the board S based on the amount of positional deviation of the component P with respect to the suction nozzle 61. Note that, when the CPU 101 of the control device 100 determines that the component P is not present, and determines that the shape, size, suction position, or the like of the component P is not normal, the CPU 101 outputs information on interruption of processing and occurrence of an error in the management device 110.

When the head unit 60 is moved to the mounting position, the CPU 101 of the control device 100 performs a suction posture detection process immediately prior to mounting in which the component suction posture of the suction nozzle 61 that moves to the immediately prior position A1 is detected (step S180), and a suction deviation determination process is performed which determines presence or absence of suction deviation of the component P during conveyance by comparing each detection value which is detected in the suction posture detection process immediately prior to mounting and each detection value which is detected in the suction posture detection process immediately after suction of step S130 (step S190). Subsequently, the CPU 101 of the control device 100 performs a mounting process in which the component P is mounted on the board S (step S200), and performs a mounting confirmation process which confirms whether or not mounting is performed (step S210). Then, the CPU 101 of the control device 100 determines whether or not the component P is present in the subsequent mounting (step S220), and when determining that the component P which is subsequently mounted is present, the CPU 101 repeats a return process in step S180 and when determining that the component P which is subsequently mounted is not present, the component mounting process routine ends.

Figure 9:
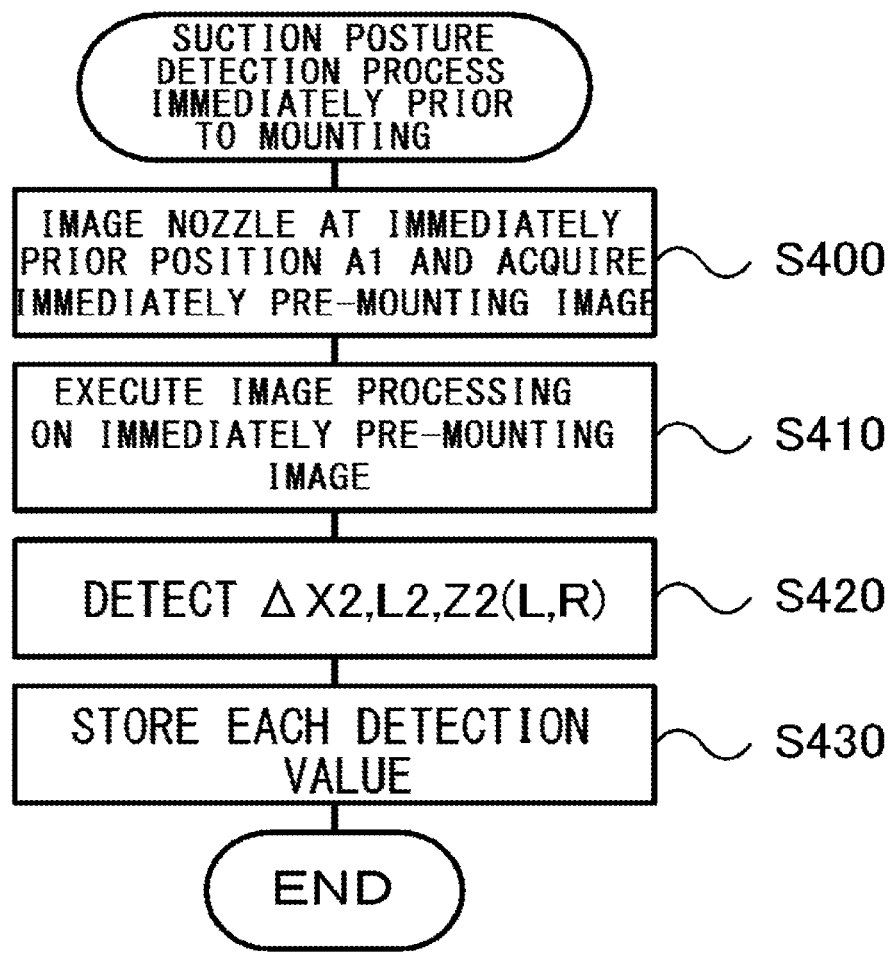
FIG. 9 is a flowchart illustrating an example of a suction posture detection process immediately prior to mounting which is executed by the CPU 101 of the control device 100.

FIG. 9 is a flow chart illustrating an example of the suction posture detection process immediately prior to mounting. Other than a point in that the CPU 101 of the control device 100 using the immediately pre-mounting image in place of the immediately post-suction image, the CPU 101 performs the suction posture detection process immediately after suction in the same manner as the suction posture detection process immediately prior to mounting described above. That is, first, the CPU 101 of the control device 100 acquires the immediately pre-mounting image by imaging the suction nozzle 61 which is at the immediately prior position A1 (step S400), executes image processing on the immediately pre-mounting image (step S410), detects an X direction deviation $\Delta X2$, Q direction deviation L2, and a Z direction position Z2 (L, R) (step S420), stores each detection value in the RAM 104 (step S430), and ends the suction posture detection process immediately after mounting. Note that, if the suction nozzle 61 is at the immediately after position A2 after the component suction operation in step S200 is performed, in the process of step S400, the CPU 101 of the control device 100 combines and acquires an immediately post-mounting image at the immediately after position A2 at which the suction nozzle 61 is imaged. Then, in a mounting confirmation process of step S210, in a case where the CPU 101 of the control device 100 executes image processing on the immediately post-mounting image and detects a pixel region of the component P, the CPU 101 determines that the component P remains where it is not possible to normally mount the component P (so-called take out of the component P), remounts the component P, and transmits error information to the management device 110. In this manner, the CPU 101 of the control device 100 acquires the immediately post-suction image, the immediately pre-mounting image, and the immediately post-mounting image by imaging of the side camera 80, and performs determination of suction deviation or take out of the component P.

Figure 10A:
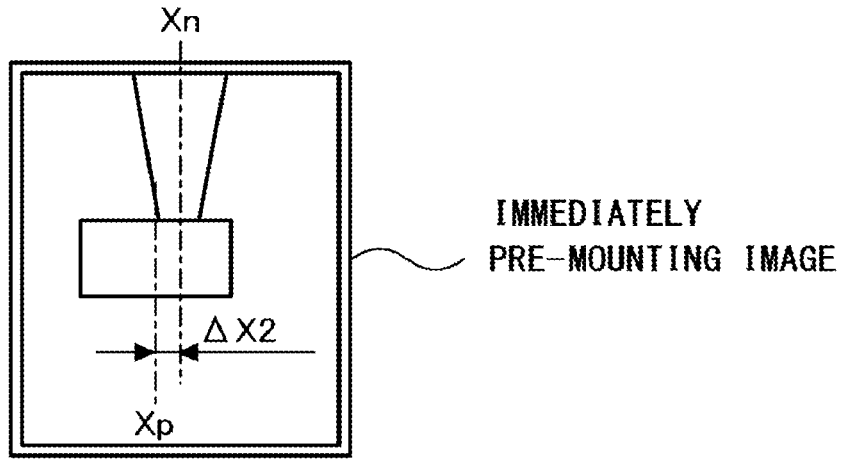
FIGS. 10A to 10C are explanatory views illustrating an example of a circumstance in which suction deviation is detected based on the immediately pre-mounting image.
Figure 10B:
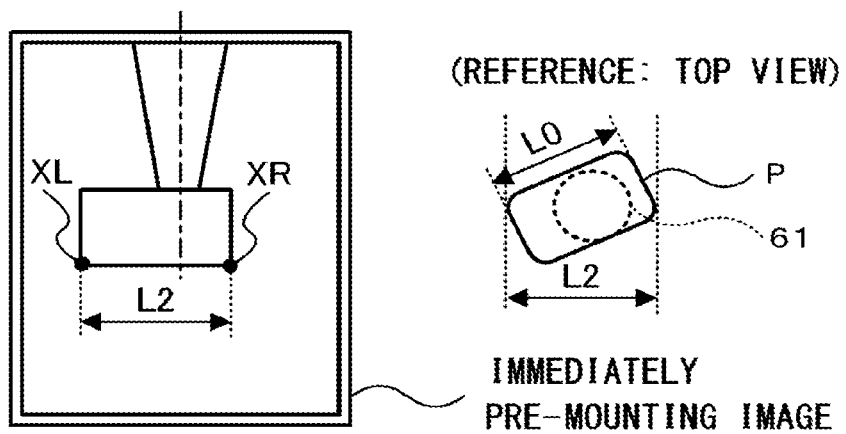
Figure 10C:
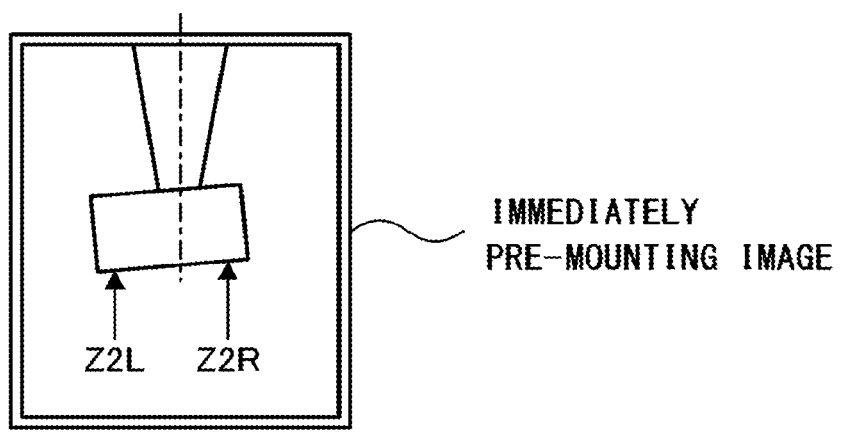

FIGS. 10A to 10C are explanatory views illustrating an example of a circumstance in which the suction posture is detected based on the immediately pre-mounting image. Here, since each suction nozzle 61 sequentially moves each position on the circumference by intermittently rotating the rotary head 64, there are cases where the suction posture of the component P changes from the immediately after suction until immediately prior to mounting by repeating acceleration and deceleration of the rotary head 64. That is, there are cases where the X direction deviation $\Delta X2$ in FIG. 10A is greatly changed from the X direction deviation $\Delta X1$ in FIG. 8A, the Q direction deviation L2 in FIG. 10B is greatly changed from the Q direction deviation L1 in FIG. 8B, and the Z direction position Z2 (L, R) in FIG. 10C is greatly changed from the Z direction position Z1 (L, R) in FIG. 8C. Note that, in the X direction deviation $\Delta X2$, in the same manner as the X direction deviation $\Delta X1$, an absolute value indicates positional deviation, and positive and negative reference numerals indicate the direction of positional deviation.

Figure 11:
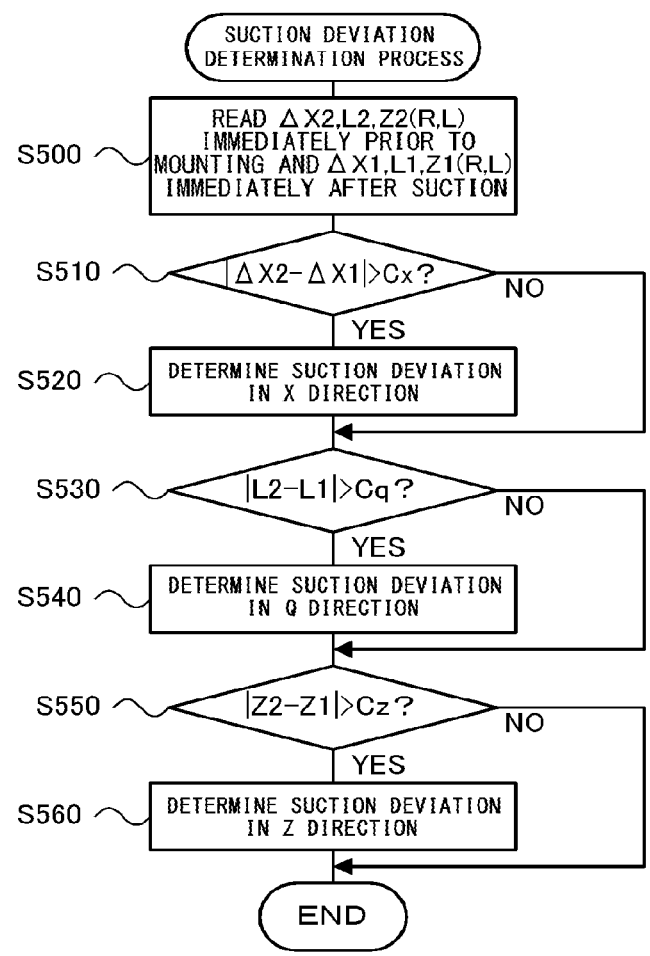
FIG. 11 is a flow chart illustrating an example of a suction deviation determination process which is executed by the CPU 101 of the control device 100.

FIG. 11 is a flow chart illustrating an example of a suction deviation determination process. In the process, first, the CPU 101 of the control device 100 reads out the X direction deviation $\Delta X2$, the Q direction deviation L2, and the Z direction position Z2 (L, R) immediately prior to mounting that is detected in the suction posture detection process immediately prior to mounting and the X direction deviation $\Delta X1$ the Q direction deviation L1, and the Z direction position Z1 (L, R) immediately after suction that is detected in the suction posture detection process immediately after suction of the same suction nozzle 61 from the RAM 104 (step S500). Then, the CPU 101 of the control device 100 determines whether or not the absolute value of the difference between the X direction deviation $\Delta X2$ and the X direction deviation $\Delta X1$ exceeds a predetermined threshold Cx (step S510), when determining that the absolute value of the difference exceeds the predetermined threshold Cx, the CPU 101 determines that there is suction deviation in the X direction (step S520), and the process proceeds to the process of the subsequent step S530, and when determining that the absolute value of the difference does not exceed the predetermined threshold Cx, the CPU 101 determines that there is no suction deviation in the X direction and the process proceeds to the process of the subsequent step S530. In this manner, the CPU 101 of the control device 100 determines that when the absolute value of the difference between the X direction deviation ΔX2 and the X direction deviation ΔX1 exceeds the predetermined threshold Cx, suction deviation is generated during conveyance by increasing and reducing the X direction deviation ΔX2. Note that, the presence or absence of suction deviation in the X direction is performed based on the absolute value of the difference between the X direction deviation ΔX2 and the X direction deviation ΔX1, but the CPU 101 of the control device 100 ascertains the direction of the positional deviation in the X direction from the positive and negative reference numerals of the difference between the X direction deviation ΔX2 and the X direction deviation ΔX1. Here, in the management device 110, the operator is able to set the threshold Cx in each type of component P. For this reason, for example, in a case where the interval between each adjacent component P such as in a case where a small type component P is adjacently mounted, the operator is able to improve mounting precision of the component P from only the small component P of suction deviation in the X direction being mounted by the control device 100 in the mounting process of step S200 by setting the threshold Cx to a small value.

Next, the CPU 101 of the control device 100 determines whether or not the absolute value of the difference between the Q direction deviation L2 and the Q direction deviation L1 exceeds a predetermined threshold Cq (step S530), when determining that the absolute value of the difference exceeds the predetermined threshold Cq, the CPU 101 determines that there is suction deviation in the Q direction (step S540), and the process proceeds to the process of the subsequent step S550, and when determining that the absolute value of the difference does not exceed the predetermined threshold Cq, the CPU 101 determines that there is no suction deviation in the Q direction and the process proceeds to the process of the subsequent step S550. In this manner, the CPU 101 of the control device 100 determines suction deviation when the absolute value of the difference between the Q direction deviation L2 and the Q direction deviation L1 exceeds the predetermined threshold Cq by increasing and reducing the Q direction deviation L2. Here, in the management device 110, the operator is able to set the threshold Cq in each type of component P. For this reason, for example, in a case where the interval between each adjacent component P is small such as in a case where a small type component P is adjacently mounted, the operator is able to improve mounting precision of the component P from only the small component P of suction deviation in the Q direction being mounted by the control device 100 in the mounting process of step S200 by setting the threshold Cq to a small value.

Next, the CPU 101 of the control device 100 determines whether or not either the absolute value of the difference between the Z direction position Z2L and the Z direction position Z1L and the absolute value of the difference between the Z direction position Z2R and the Z direction position Z1R exceeds a predetermined threshold Cz (step S550), when determining that either absolute value of the difference exceeds the predetermined threshold Cz, the CPU 101 determines that there is suction deviation in the Z direction (so-called upright suction or oblique suction) (step S560), and suction deviation determination process ends, and when determining that either absolute value of the difference does not exceed the predetermined threshold Cz, the CPU 101 determines that there is no suction deviation in the Z direction and suction deviation determination process ends. In this manner, the CPU 101 of the control device 100 determines suction deviation when either the absolute value of the difference between the Z direction position Z2L and the Z direction position Z1L and the absolute value of the difference between the Z direction position Z2R and the Z direction position Z1R exceed the predetermined threshold Cz by greatly changing the Z direction positions Z2L and Z2R. Here, in the management device 110, the operator is able to set the threshold Cz in each type of component P. For this reason, for example, in a small type component P with a small height in the Z direction, the operator is able to improve mounting precision of the component P from only the small component P of suction deviation in the Z direction being mounted by the control device 100 in the mounting process of step S200 by setting the threshold Cz to a small value.

Figure 12:
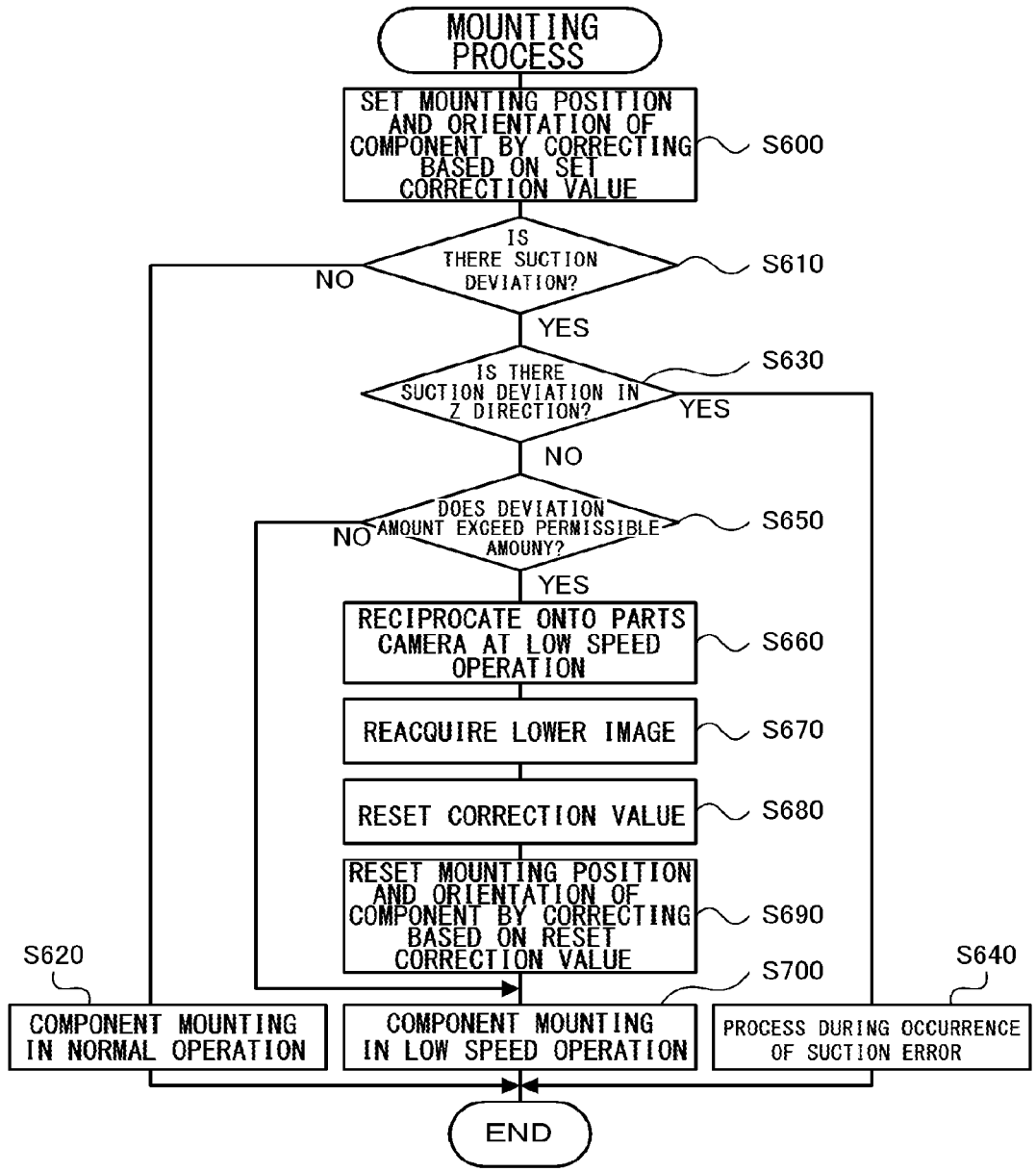
FIG. 12 is a flow chart illustrating an example of a mounting process which is executed by the CPU 101 of the control device 100.

FIG. 12 is a flow chart illustrating an example of a mounting process. First, the CPU 101 of the control device 100 sets the mounting position and the orientation (angle) of the component P of the mounting target by performing correction based on a correction value that is set in the process in S170 of the component mounting process routine in FIG. 6 (step S600), and determines whether or not there is any suction deviation in suction deviation determination process described above (step S610). When determining that there is no suction deviation, the CPU 101 of the control device 100 performs mounting of the component P in normal operation (high speed operation) (step S620), and the mounting process ends. In the mounting of the component P in normal operation, the CPU 101 of the control device 100 controls the X-axis actuator 55 and the Y-axis actuator 59 such that the working position A0 of the rotary head 64 is moved up to a position on the mounting position of the component P set in step S600 by the head unit 60 at normal speed and normal acceleration. In addition, the CPU 101 of the control device 100 controls the Q-axis actuator 69 such that the suction nozzle 61 rotates in an orientation that is set in step S600, and controls the R-axis actuator 66 and the Z-axis actuator 70 such that the suction nozzle 61 rotatably moves and lowers at normal speed and normal acceleration up to the mounting position immediately below the working position A0. Then, the CPU 101 of the control device 100 mounts the component P on the board S by controlling the electromagnetic valve 79 and causing a positive pressure to act on the suction port of the suction nozzle 61. Note that, when the component P is mounted on the board S, the CPU 101 of the control device 100 performs a process such as controlling the Z-axis actuator 70 and raising the suction nozzle 61 to the working position A0.

Meanwhile, when determining that there is suction deviation in step S610, the CPU 101 of the control device 100 determines whether or not suction deviation is suction deviation in the Z direction (step S630). When determining that there is suction deviation in the Z direction, the CPU 101 of the control device 100 executes a process during occurrence of suction error (step S640), and the mounting process ends. As the process during occurrence of error, the CPU 101 of the control device 100 performs a process of transferring information in which mounting of the component P is not performed and the type of information of suction deviation to the management device 110 since suction deviation is generated in the component P, discarding the component P in which there is suction deviation to a predetermined discard position, and the like. Note that, the CPU 101 of the control device 100 not performing mounting of the component P in the case of suction deviation in the Z direction is since it is not possible to normally mount the component P that is subject to upright suction.

In addition, when there is suction deviation in the X direction or the Q direction without suction deviation in the Z direction in step S630, the CPU 101 of the control device 100 determines whether or not the amount of deviation exceeds a permitted amount (step S650). As the permitted amount, it is possible for the CPU 101 of the control device 100 to use a slightly larger value than the threshold Cx or the threshold Cq and a value that is able to determine that mounting of the component P is possible, as long as suction deviation is not increased although suction deviation is generated. In addition, in a case where the X direction deviation ΔX2 exceeds a first predetermined value or a case where the Q direction deviation L2 exceeds a second predetermined value, the CPU 101 of the control device 100 is able to determine that the amount of deviation exceeds the permissible amount. Note that, in a case where high mounting precision in the board S within a process or a component P of the mounting target is required, without performing determination in step S650, the CPU 101 of the control device 100 may perform the process during occurrence of suction error in step S640 in the same manner as the case of suction deviation in the Z direction being generated.

When determining that the deviation amount does not exceed the permissible amount in step S650, the CPU 101 of the control device 100 performs mounting of the component P in low speed operation at a lower speed than in the normal operation (step S700), and the mounting process ends. In the mounting of the component P in this case of low speed operation, the CPU 101 of the control device 100 controls the X-axis actuator 55 and the Y-axis actuator 59 such that the head unit 60 moves at low speed and low acceleration until the working position A0 of the rotary head 64 is positioned above the mounting position of the component P set in step S600. In addition, the CPU 101 of the control device 100 controls the Q-axis actuator 69 such that the suction nozzle 61 rotates in an orientation that is set in step S600, and controls the R-axis actuator 66 and the Z-axis actuator 70 such that the suction nozzle 61 rotatably moves and lowers at low speed and low acceleration up to the mounting position immediately below the working position A0. Then, the CPU 101 of the control device 100 mounts the component P on the board S by controlling the electromagnetic valve 79 and causing a positive pressure to act on the suction port of the suction nozzle 61. In this manner, at the low speed operation, it is possible to suppress a large force acting accompanying acceleration and deceleration in the component P that is mounted by the suction nozzle 61. For this reason, the component mounting device 10 is able to suppress suction deviation that is generated in the component P from increasing and prevent occurrence of mounting defects by mounting the component P in the low speed operation.

Meanwhile, when determining that the deviation amount exceeds the permissible amount in step S650, the CPU 101 of the control device 100 controls the X-axis actuator 55 and the Y-axis actuator 59 such that the head unit 60 reciprocally moves at low speed and low acceleration until just above the parts camera 90 (step S660). In addition, when the head unit 60 reaches just above the parts camera 90, the CPU 101 of the control device 100 images from below the component P in which it is determined that the deviation amount exceeds the permissible amount and reacquires the lower image of the component P (step S670), and resets the correction value by executing image processing on the reacquired lower image (step S680). Then, the CPU 101 of the control device 100 resets the mounting position and orientation (angle) of the component P of the mounting target by performing correction based on the reset correction value (step S690), performs mounting of the component P in the low speed operation so as to be at the reset mounting position and orientation (step S700), and the mounting process ends. In this manner, in a case where suction deviation is generated which exceeds the permissible amount in the X direction and the Q direction, since the CPU 101 of the control device 100 mounts the component P after the correction value is reset when the component P is mounted based on suction deviation, it is possible to prevent occurrence of mounting defects. In addition, when the correction value is reset, the CPU 101 of the control device 100 reciprocally moves the head unit 60 on the parts camera 90 at low speed and low acceleration, therefore it is possible to suppress suction deviation which is generated in the component P from increasing.

Here, the correspondence relationship between constituent elements of the present embodiment and configuration elements of the present disclosure is clarified. The component mounting device 10 of the present embodiment is equivalent to the component mounting device of the present disclosure, the component supply device 20 is equivalent to the component supply device, the suction nozzle 61 is equivalent to the nozzle, the rotary head 64 is equivalent to the head, the CPU 101 of the control device 100 which executes the processes of steps S110, S120, S150, and S200 of the component mounting process routine in FIG. 6 is equivalent to the control means, the CPU 101 of the control device 100 which executes the process S300 of the mounting posture detection process immediately after suction in FIG. 7 and the process S400 of the suction posture detection process immediately prior to mounting in FIG. 9 and the side camera 80 are equivalent to the side imaging means, and the CPU 101 of the control device 100 which executes the processes of steps S310 to S330 of the suction posture detection process immediately after suction in FIG. 7, the process of steps S410 to S430 of the suction posture detection process immediately prior to mounting in FIG. 9, and the suction deviation determination process in FIG. 11 is equivalent to the determination means. In addition, the CPU 101 of the control device 100 which executes the process of step S160 of the component mounting process routine in FIG. 6 and the parts camera 90 are equivalent to the lower imaging means, and the CPU 101 of the control device 100 which executes the process of step S170 of the component mounting process routine is equivalent to the setting means.

The component mounting device 10 of the present embodiment which is described above is provided with a rotary head 64 to which the plurality of suction nozzles 61 are attached, and is able to detect occurrence of suction deviation on the component P during suction by the suction nozzle 61 caused by movement of the suction nozzle 61 due to rotation of the rotary head 64, since the component mounting device 10 detects presence or absence of suction deviation (posture change) of the component P from after component suction until prior to component mounting based on the immediately post-suction image which is acquired by imaging the suction nozzle 61 from the side immediately after suction of the component and the immediately pre-mounting image that is acquired by imaging the suction nozzle 61 from the side immediately prior to mounting of the component. In this manner, it is possible to appropriately detect that the component posture changes during component conveyance so as not to correctly mount the component P even if the component posture is correct after suction of the component P.

In addition, the component mounting device 10 is able to prevent mounting defects caused by suction deviation in the X direction since the component mounting device 10 determines the presence or absence of suction deviation of the component P in the X direction based on the X direction deviation $\Delta X1$ of the immediately post-suction image and the X direction deviation $\Delta X2$ of the immediately pre-mounting image. In addition, the component mounting device 10 is able to prevent mounting defects caused by suction deviation in the Q direction since the component mounting device 10 determines the presence or absence of suction deviation of the component P in the Q direction based on the Q direction deviation L1 of the immediately post-suction image and the Q direction deviation L2 of the immediately pre-mounting image. In addition, the component mounting device 10 is able to prevent mounting defects caused by suction deviation in the Z direction since the component mounting device 10 determines the presence or absence of suction deviation (upright suction or oblique suction) of the component P in the Z direction based on the Z direction position Z1 (L, R) of the immediately post-suction image and the Z direction position Z2 (L, R) of the immediately pre-mounting image. In addition, the component mounting device 10 configures an optical system unit of the side camera 80 such that the orientation at which the suction nozzle 61 is imaged is the same orientation at the immediately after position A2 at which the immediately post-suction image is acquired and the immediately prior position A1 at which the immediately pre-mounting image is acquired, therefore it is possible to easily perform comparison of the immediately post-suction image and the immediately pre-mounting image, and it is possible to quickly detect suction deviation of the component P. In addition, the side camera 80 is also used in determination of taking out the component P immediately after mounting, therefore in comparison to providing separate cameras in determination of taking out and determination of suction deviation, it is possible to set the component mounting device 10 with a compact configuration. In addition, the component mounting device 10 uses the side camera 80 which is attached to the head unit 60, acquires the immediately post-suction image by imaging the suction nozzle 61 which is at the immediately after position A2 and acquires the immediately pre-mounting image by imaging the suction nozzle 61 which is at the immediately prior position A1, and it is not necessary to operate the head unit 60 that is only for acquiring the immediately post-suction image or the immediately pre-mounting image, therefore it is possible to prevent a large reduction of the production efficiency of the component mounting process for determining suction deviation.

Furthermore, in a case where the deviation amount is within the permissible amount, the CPU 101 of the control device 100 causes the suction nozzle 61 to operate at lower speed to suck the component P in comparison to a case where suction deviation is not generated even if suction deviation in the X direction and suction deviation in the Q direction is generated, therefore it is possible to appropriately mount the component P to prevent an increase of suction deviation. In addition, the component mounting device 10 is provided with the parts camera 90 which images the component P from below, and the CPU 101 of the control device 100 sets the correction value based on the lower image which is acquired by imaging the component P using the parts camera 90 and mounts the component P after performing correction (correction of position or orientation) which relates to the mounting position of the component P based on the set correction value. Then, in a case where suction deviation in the X direction or suction deviation in the Q direction is generated, the CPU 101 of the control device 100 resets the correction value based on the lower image which is reacquired by imaging the component P once again using the parts camera 90 and mounts the component P after performing correction which relates to the mounting position of the component P based on the reset correction value. For this reason, in a case where suction deviation of the component P is increased after the correction value is set and the like, it is possible to prevent occurrence of mounting defects when the component P is mounted based on the correction value that is initially set. In addition, in a case where the generated suction deviation is suction deviation in the Z direction such as upright suction, the CPU 101 of the control device 100 is able to appropriately cope according to the type of suction deviation since the component P is not mounted regardless of the deviation amount.

Note that, needless to say, the present disclosure is not limited to the embodiments described above, and it is possible to execute various forms within the technical scope of the present disclosure.

For example, in the embodiment described above, the immediately post-suction image is acquired by the side camera 80 imaging the suction nozzle 61 at the immediately after position A2, but is not limited thereto, and the rotary head 64 may start rotation after raising the suction nozzle 61 after suction to the working position A0 and acquire the immediately post-suction image by the side camera 80 imaging the suction nozzle 61 that is raised to the working position A0. Alternatively, the side camera 80 may be configured such that the suction nozzle 61 is imaged at the subsequent position to the immediately after position A2 or the like or another position and acquire the post-suction image at the other position. In addition, the immediately pre-mounting image is acquired by the side camera 80 imaging the suction nozzle 61 at the immediately prior position A1, but is not limited thereto, and the suction nozzle 61 may be lowered after rotation of the rotary head 64 stops by moving the suction nozzle 61 to the working position A0 prior to mounting and the immediately pre-mounting image may be acquired by the side camera 80 imaging the suction nozzle 61 that is moved to the working position A0. Alternatively, the side camera 80 may be configured such that the suction nozzle 61 is imaged at the prior position to the immediately prior position A1 or the like or another position and acquire the pre-mounting image at the other position.

In the embodiment described above, a camera for acquiring the immediately post-suction image by imaging the suction nozzle 61 of the immediately after position A2 and a camera for acquiring the immediately pre-mounting image by imaging the suction nozzle 61 of the immediately prior position A1 are both used in one side camera 80, but are not limited thereto, and a dedicated camera for acquiring the immediately post-suction image and a dedicated camera for acquiring the immediately pre-mounting image may be respectively provided.

In the embodiment described above, the CPU 101 of the control device 100 determines three suction deviations of suction deviation in the X direction, suction deviation in the Q direction, and suction deviation in the Z direction, and is not limited to, but may determine either one or two suction deviations.

In the embodiment described above, the Q-axis actuator 69 which rotates the nozzle holder 62 that holds the suction nozzle 61 is individually provided in each nozzle holder 62, but is not limited thereto, and the Q-axis actuator may be provided in common with all nozzle holders 62. In this case, each suction nozzle 61 rotates to a degree that mounting of the component P of the suction nozzle 61 is performed between movement from the immediately after position A2 to the immediately prior position A1. For this reason, when the amount of rotation of accumulation of movement from the immediately after position A2 to the immediately prior position A1 are respectively stored in each suction nozzle 61 and moves to the immediately prior position A1, the suction nozzle 61 is rotated such that the amount of rotation of accumulation is canceled out, therefore the immediately post-mounting image may be acquired by imaging the suction nozzle 61. By doing so, even in a case where the Q-axis actuator is provided in common in all nozzle holders 62, the side camera 80 is able to image the suction nozzle 61 and component P from the same orientation at the immediately after position A2 and the immediately prior position A1.

In the embodiment described above, the CPU 101 of the control device 100 mounts the component P in the low speed operation in a case where the deviation amount of suction deviation in the X direction or the Q direction is within the permissible amount, and mounts the component P in the low speed operation by resetting the correction value based on the lower image that is reacquired by moving the head unit 60 on the parts camera 90 once again in the low speed operation in a case where the deviation amount of suction deviation in the X direction or the Q direction exceeds the permissible amount, but is not limited thereto. For example, the CPU 101 of the control device 100 may mount the component P in the normal operation in a case where the deviation amount of suction deviation in the X direction or the Q direction is within the permissible amount. In addition, the CPU 101 of the control device 100 may resume production by continuing suction without change of the component P to which suction deviation occurs by the suction nozzle 61. In this case, the suction nozzle 61 which sucks the component P to which suction deviation occurs does not suck a new component P. In addition, in the embodiment, the CPU 101 of the control device 100 sucks the component P as long as both suction deviation in the X direction and suction deviation in the Q direction are within the permissible amount even if generated, but a process may be performed during occurrence of suction error without performing mounting of the component P in a case where both suction deviation in the X direction and suction deviation in the Q direction are generated, and the component P may be mounted by moving the suction nozzle 61 in the low speed operation in a case where only one of suction deviation in the X direction and suction deviation in the Q direction is generated and the deviation amount is within the permissible amount. Alternatively, the CPU 101 of the control device 100 may not perform mounting of the component P regardless of the deviation amount in a case where it is determined that suction deviation is generated.

In the embodiment described above, the CPU 101 of the control device 100 acquires the immediately post-mounting image that is imaged by the side camera 80, but is not limited thereto, and even if the immediately post-mounting image is not acquired, that is, determination of taking out of the component P may not be performed.

INDUSTRIAL APPLICABILITY

The present disclosure is able to utilize the manufacturing industry and the like of the component mounting device.

1: component mounting system, 10: component mounting device, 12: housing, 14: base, 20: component supply device, 22: tape feeder, 22a: reel, 22b: feeder section, 30: board conveyance device, 32a, 32b: conveyor rail, 34a, 34b: conveyor belt, 40: back-up device, 42: back-up plate, 44: base plate, 46: back-up pin, 50: moving mechanism, 52, 56: guide rail, 54: X-axis slider, 55: X-axis actuator, 58: Y-axis slider, 59: Y-axis actuator, 60: head unit, 61: suction nozzle, 62: nozzle holder, 62a: upper end portion, 62b: flange portion, 64: rotary head, 64a: reflective body, 65: spring (coil spring), 66: R-axis actuator, 67: rotary shaft, 68: driving motor, 69: Q-axis actuator, 70: Z-axis actuator, 72: ball screw nut, 74: screw shaft, 76: Z-axis slider, 77: lever portion, 78: driving motor, 79: electromagnetic valve, 80: side camera, 82: camera main body, 84: housing, 86a: center incident port, 86b: left incident port, 86c: right incident port, 86d: camera connection port, 87: luminous body, 88a, 88b, 88c: first prism, 88d: second prism, 90: parts camera, 92: mark camera, 94: nozzle stocker, 100: control device, 101, 111: CPU, 102, 112: ROM, 103, 113: HDD, 104, 114: RAM, 105, 115: input and output interface, 106, 116: bus, 110: management device, 117: input device, 118: display, A0: working position (suction position, mounting position), A1: immediately prior position (immediately pre-mounting position), A2: immediately after position (immediately post-suction position, immediately post-mounting position), P: component, S: board

The invention claimed is:
1. A component mounting device comprising:
a head unit that includes a rotary type head including a plurality of nozzles configured to suck a component;
a moving mechanism attached to the head unit, the moving mechanism configured to move the head unit in at least two directions;
a side camera attached to the head unit, the side camera configured to acquire a post-suction image by imaging a nozzle of the plurality of nozzles from a side of the nozzle after suction of the component and configured to acquire a pre-mounting image by imaging the nozzle from the side prior to mounting of the component after acquiring the post-suction image; and
processing circuitry operatively connected to the rotary type head, the moving mechanism, and the side camera, the processing circuitry configured to control the rotary type head and the moving mechanism to sequentially move the plurality of nozzles above a supply position of a component supply device as a target position so as to suck the component, configured to control the rotary type head to sequentially move the plurality of nozzles above a mounting position of a mounting target as the target position, and configured to control the rotary type head to mount the component on the mounting target,
wherein the processing circuitry is configured to determine a posture change of the component on the nozzle from after the suction of the component prior to the mounting of the component based on the post-suction image and the pre-mounting image.
2. The component mounting device according to claim 1, wherein the processing circuitry is configured to determine positional deviation in a left and right direction of the component as the posture change based on a position in the left and right direction of the component with respect to the nozzle in the post-suction image and a position in the left and right direction of the component with respect to the nozzle in the pre-mounting image.

3. The component mounting device according to claim 1, wherein the processing circuitry is configured to determine positional deviation in a rotation direction of the component as the posture change based on a length in the left and right direction of the component in the post-suction image and a length in the left and right direction of the component in the pre-mounting image.

4. The component mounting device according to claim 1, wherein the processing circuitry is configured to determine positional deviation in a height direction of the component as the posture change based on a lower end position of the component in the post-suction image and a lower end position of the component in the pre-mounting image.

5. The component mounting device according to claim 1, further comprising:
a lower camera positioned below a moving path of the moving mechanism, the lower camera configured to acquire a lower image by imaging from below the component which is sucked by the nozzle prior to acquisition of the pre-mounting image,
wherein the processing circuitry is configured to set a correction value according to an amount of positional deviation of the component with respect to the nozzle based on the lower image,
wherein the lower camera reacquires the lower image by reimaging the component from below in a case where it is determined that the posture change of the component exceeds a permissible range by the processing circuitry,
wherein the processing circuitry resets the correction value based on the reacquired lower image, and
wherein the processing circuitry controls the rotary type head and the moving mechanism such that the component is mounted after correction is performed based on the set correction value in a case where it is determined that the posture change of the component does not exceed the permissible range, and controls the rotary type head and the moving mechanism such that the component is mounted after correction is performed based on the reset correction value in a case where it is determined that the posture change of the component exceeds the permissible range.

6. The component mounting device according to claim 1, wherein the processing circuitry rotatably controls the rotary type head intermittently at each predetermined angle such that the plurality of nozzles are sequentially moved to each target position,
wherein the side camera acquires the post-suction image by imaging the nozzle when the nozzle is at an immediately post-suction position advanced from the target position above the supply position by the predetermined angle, and acquires the pre-mounting image by imaging the nozzle when the nozzle is at an immediately pre-mounting position prior to the target position above the mounting position by the predetermined angle, and
wherein an orientation of the nozzle which is imaged at the immediately post-suction position and an orientation of the nozzle which is imaged at the immediately pre-mounting position are the same orientation.

7. The component mounting device according to claim 1, wherein the side camera acquires an image after mounting by imaging the nozzle from the side after mounting of the component, and
wherein the processing circuitry is configured to determine whether the component is mounted on the mounting target by the nozzle based on the image after mounting.

* * * * *